(12) United States Patent
Shioya et al.

(10) Patent No.: US 6,911,405 B2
(45) Date of Patent: Jun. 28, 2005

(54) SEMICONDUCTOR DEVICE AND METHOD OF MANUFACTURING THE SAME

(75) Inventors: Yoshimi Shioya, Tokyo (JP); Kouichi Ohira, Tokyo (JP); Kazuo Maeda, Tokyo (JP); Tomomi Suzuki, Tokyo (JP); Youichi Yamamoto, Tokyo (JP); Yuichiro Kotake, Tokyo (JP); Hiroshi Ikakura, Tokyo (JP); Shoji Ohgawara, Tokyo (JP)

(73) Assignees: Canon Sales Co., Inc. (JP); Semiconductor Process Laboratory Co., Ltd. (JP)

( * ) Notice: Subject to any disclaimer, the term of this patent is extended or adjusted under 35 U.S.C. 154(b) by 0 days.

(21) Appl. No.: 09/988,685

(22) Filed: Nov. 20, 2001

(65) Prior Publication Data

US 2002/0123218 A1 Sep. 5, 2002

(30) Foreign Application Priority Data

Nov. 30, 2000 (JP) ........................ 2000-366358
Nov. 12, 2001 (JP) ........................ 2001-345725

(51) Int. Cl.$^7$ .................. H01L 21/76; H01L 21/44; H01L 21/26
(52) U.S. Cl. .................. 438/798; 438/430; 438/431; 438/687
(58) Field of Search .................. 438/622, 624, 438/635, 781, 687, 626, 636, 637, 700

(56) References Cited

U.S. PATENT DOCUMENTS

| | | | | |
|---|---|---|---|---|
| 6,066,196 A | * | 5/2000 | Kaloyeros et al. | 106/1.18 |
| 6,089,445 A | * | 7/2000 | Sindzingre et al. | 228/218 |
| 6,090,699 A | | 7/2000 | Aoyama et al. | 438/622 |
| 6,114,238 A | | 9/2000 | Liao | 438/648 |
| 6,136,680 A | | 10/2000 | Lai et al. | 438/597 |
| 6,153,507 A | | 11/2000 | Mikagi | 438/618 |
| 6,165,894 A | * | 12/2000 | Pramanick et al. | 438/627 |
| 6,410,462 B1 | * | 6/2002 | Yang et al. | 438/788 |
| 6,479,408 B2 | * | 11/2002 | Shioya et al. | 438/789 |
| 6,576,980 B1 | * | 6/2003 | Shao et al. | 257/632 |
| 2001/0021590 A1 | | 9/2001 | Matsuki | 438/780 |
| 2001/0037568 A1 | * | 11/2001 | Uner et al. | 29/841 |

FOREIGN PATENT DOCUMENTS

| | | |
|---|---|---|
| EP | 0 771 886 A1 | 5/1997 |
| JP | 7-230991 | 8/1995 |
| JP | 9-8033 | 1/1997 |
| JP | 9-186153 | 7/1997 |
| JP | 10-199881 | 7/1998 |
| JP | 11-16906 | 1/1999 |
| JP | 11-288931 | 10/1999 |
| JP | 2002-526916 | 8/2002 |
| WO | 00/19498 | 4/2000 |

OTHER PUBLICATIONS

Furusawa et al., Simple, reliable Cu/low–k interconnect integration using mechanically strong low–k dielectric material: silicon–oxycarbide (Jun. 2000), IEEE, International technology conference, pp. 222–224.*

* cited by examiner

*Primary Examiner*—Carl Whitehead, Jr.
*Assistant Examiner*—David L. Hogans
(74) *Attorney, Agent, or Firm*—Lorusso, Loud & Kelly

(57) ABSTRACT

A process gas consisting of one of $N_2$, $N_2O$ or a mixture thereof is converted to a plasma and then a surface of a copper wiring layer is exposed to the plasma of the process gas, whereby a surface portion of the copper wiring layer is reformed and made into a copper diffusion preventing barrier. According to this method, a noble semiconductor device can be provided having increased operational speed and less copper diffusion.

18 Claims, 14 Drawing Sheets

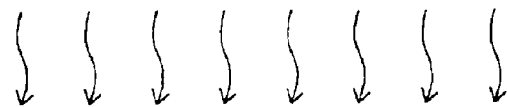

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same and, more particularly, to preventing the diffusion of the copper of the copper wiring layer.

2. Description of the Related Art

In recent years, in order to increase the operational speed of a semiconductor element such as a LSI, etc., an insulating film having a low dielectric constant (referred to as a "low dielectric constant film" hereinafter) is formed on the copper wiring layer as the interlayer insulating film. In this structure, the low dielectric constant film is formed on the copper wiring layer as an interlayer insulating film, and then a via hole is formed in this low dielectric constant film to expose the copper wiring layer. In forming this via hole, a block insulating film is formed on the copper wiring layer in advance, and then the interlayer insulating film is formed on this block insulating film. The block insulating film serves as an etching stopper film when etching the interlayer insulating film. The block insulating film serves also as a copper diffusion preventing film, which prevents copper contained in the copper wiring layer from diffusing into the interlayer insulating film.

In the prior art, a silicon nitride film (referred to as "SiN film" hereinafter), which is superior in preventing the copper diffusion, is used for the block insulating film.

SiN film, however, has a problem in that it lowers the operational speed of the semiconductor device due to its high dielectric constant (about 7).

Low dielectric constant films, as a substitute for the SiN film, are also known to be used for the block insulating film. These low dielectric constant films are formed using a CVD method (Chemical Vapor Deposition method), and the reaction gases for this method consist of methylsilane ($Si(CH_3)_4$) and $CH_4$ or organic silane and $CH_4$. These methods, however, are problematic because a large number of Si—C bonds are formed in the low dielectric constant film. Since the Si—C bonds increase the leakage current in the film, the block film formed as above has the problem that the leakage current is large.

SUMMARY OF THE INVENTION

It is an object of the present invention to provide a novel semiconductor device capable of preventing the diffusion of the copper for the copper wiring layer and a method of manufacturing the same.

According to the semiconductor device manufacturing method of the present invention, a process gas containing any one of $N_2$ and $N_2O$ is converted to a plasma and then the surface of the copper wiring layer is exposed to the process gas plasma. Alternatively, a process gas containing $N_2$ and $NH_3$ may be used to form the plasma in place of above gas and then the surface of the copper wiring layer may be exposed to this process gas plasma.

It has been discovered that a surface layer portion of the copper wiring layer is reformed by these plasma processes and such surface layer portion functions as a copper diffusion preventing layer. This means that the copper wiring layer itself has the function of preventing the diffusion of copper. Therefore, a high capability for preventing copper diffusion is not required of the copper diffusion preventing film (the block insulating film, etc.) formed on the copper wiring layer. Therefore, there is no need to use the high dielectric films (SiN film or like) of the prior art, which are considered to have a superior ability to prevent the copper diffusion.

Accordingly, in the present invention, films having a relatively low dielectric constant can be formed on the copper wiring layer, in place of the high dielectric constant film in the prior art. Examples of the films having such a relatively low dielectric constant are the silicon-containing insulating films such as a SiOCH film, a SiO film, a SiONCH film, a SiCH film, a SiCNH film, and the like. If the high dielectric constant is not problematic, however, a SiN film may be employed.

The so-called damascene structure may be formed on this silicon-containing insulating film. In order to obtain the damascene structure, the interlayer insulating film is formed on the silicon-containing insulating film, then a via hole is formed in the silicon-containing insulating film and the interlayer insulating film, then a plug connected electrically to the copper wiring layer is buried in the via hole, and upper wiring connected electrically to the plug is formed on the interlayer insulating film. As described above, since the surface layer portion of the copper wiring layer is reformed to function as the copper diffusion preventing layer, the diffusion of the copper into the silicon-containing insulating film and the interlayer insulating film is prevented.

Moreover, if the surface of this copper wiring layer is exposed to the $NH_3$ plasma before the surface layer portion of the copper wiring layer is reformed, the natural oxide film formed on the surface of the copper wiring can be removed. If the natural oxide film is removed in this manner, the film formed on the copper wiring layer becomes difficult to peel off from the copper wiring layer.

Furthermore, instead of reforming the surface portion of the copper wiring in the above manner, a silicon-containing insulating film may be formed on the copper wiring layer which has not been subjected to the above-described reforming process. In this case, after forming the silicon-containing insulating film, process gas containing at least one of $NH_3$, $N_2$, and $N_2O$ is converted to a plasma and then the surface of the silicon-containing insulating film is exposed to the process gas plasma. It has been discovered that the silicon-containing insulating film is reformed by this plasma process and that the reformed silicon-containing insulating film functions as a copper diffusion preventing film.

The silicon-containing insulating film to be reformed may be a SiOCH film, a SiO film, a SiN film, a SiONCH film, a SiCH film, a SiCNH film, or the like. Among these films, the SiOCH film and the SiONCH film can be formed by chemical vapor deposition using a reaction gas that contains a compound having siloxane bonds. If a compound having siloxane bonds is employed, a SiOCH film or a SiONCH film which has a low dielectric constant and which suppresses leakage current can be formed. As a result, with the SiOCH film and the SiONCH film, there is no problem that the leakage current will be increased as in the prior art or that the operational speed of the semiconductor device will be slow due to the high dielectric constant of the SiN film.

The so-called damascene structure may also be formed on the silicon-containing insulating film that is reformed in this manner. In order to obtain a damascene structure, an interlayer insulating film is formed on the reformed silicon-containing insulating film, then a via hole is formed in the silicon-containing insulating film and the interlayer insulating film, then a plug connected electrically to the copper wiring layer is buried in the via hole, and then upper wiring connected electrically to the plug is formed on the interlayer insulating film. As described above, since the reformed silicon-containing insulating film can function as the copper diffusion preventing film, the copper can be prevented from diffusing into the silicon-containing insulating film and into the interlayer insulating film.

DESCRIPTION OF THE PREFERRED EMBODIMENTS

Next, preferred embodiments of the present invention will be explained with reference to the accompanying drawings hereinafter.

Figure 1:
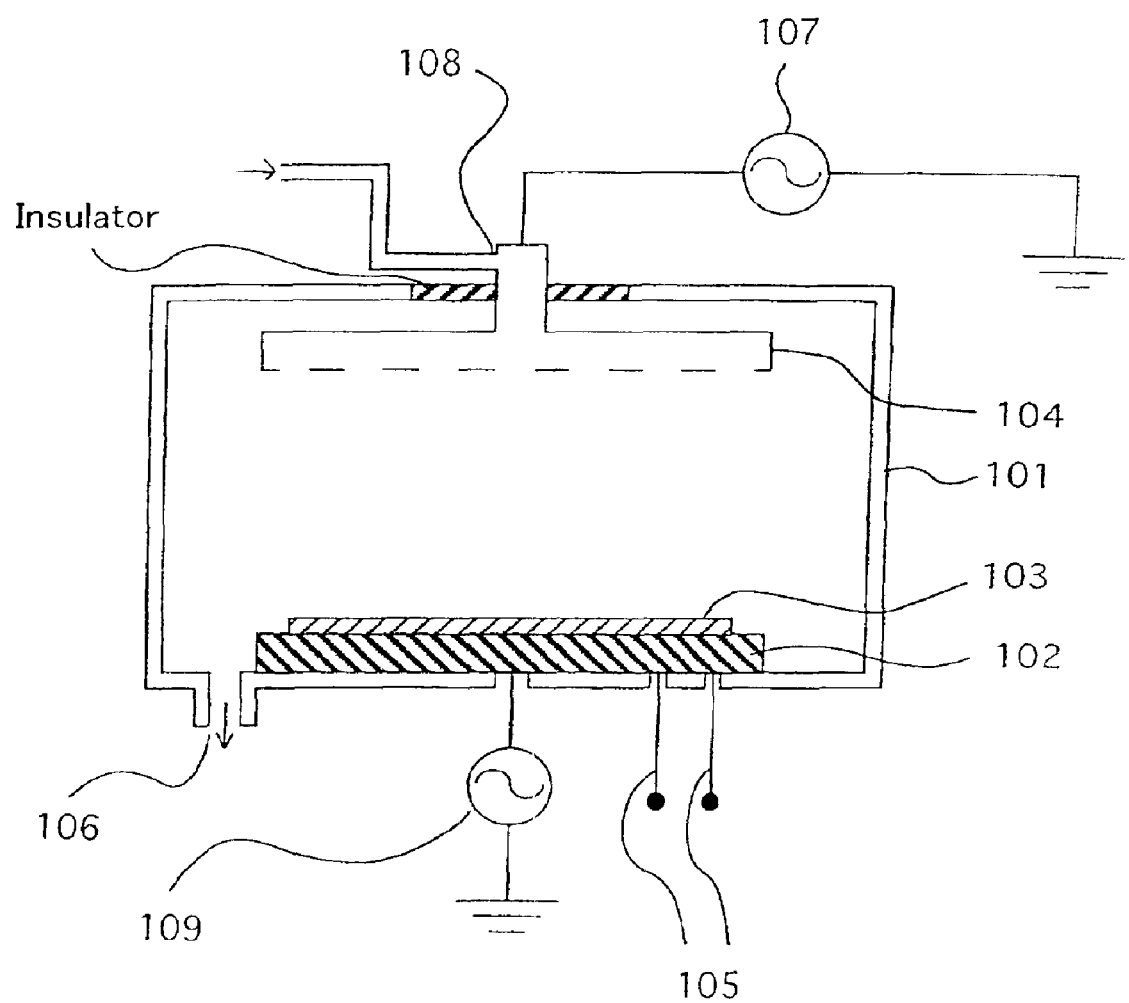
FIG. 1 is a sectional view showing the semiconductor manufacturing apparatus employed in an embodiment of the present invention.

Explanation of the Semiconductor Manufacturing Apparatus Employed in the Preferred Embodiments FIG. 1 is a sectional view showing the semiconductor manufacturing apparatus employed in the preferred embodiments.

In FIG. 1, 101 denotes a chamber in which the film formation and the plasma process are carried out. Provided in the chamber 101 are two opposing electrodes, i.e., a lower electrode 102 and an upper electrode 104. The lower and upper electrodes 102, 104 both have an almost circular planar shape of a diameter of about 230 mm.

The lower electrode 102 is also used as a loading table on which a substrate 103 is loaded. A heater (not shown) for heating the substrate 103 up to a desired temperature is built into this lower electrodes 102. In FIG. 1, 105 denotes power supply wiring for supplying power to the heater.

In addition, the upper electrode 104 is also used as a shower head for supplying a gas into the chamber 101.

A first high frequency power supply 107 and a second high frequency power supply 109 are connected to the two electrodes 104, 102 respectively. The gas in the chamber 101 can be converted to a plasma by applying high frequency power to the gas from one or both of these high frequency power supplies 107, 109.

A gas introducing port 108 is provided in the upper electrode 104, and the gas is introduced into the chamber 101 through the gas introducing port 108. An exhaust port 106 is provided for the chamber 101, and the gas introduced into the chamber 101 is exhausted via the port 106 to reduce the pressure in the chamber 101.

Figure 2A:
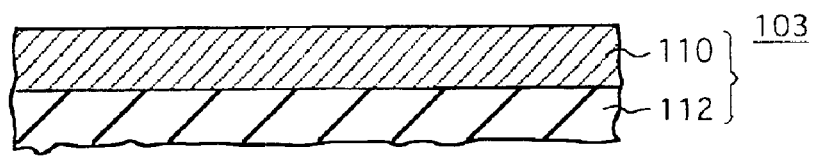
FIGS. 2A to 2C are sectional views showing steps of manufacturing a semiconductor device according to a first embodiment of the present invention.
Figure 2B:
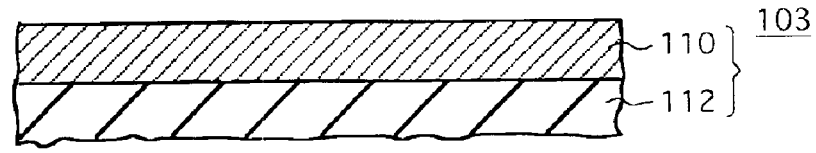
Figure 2C:
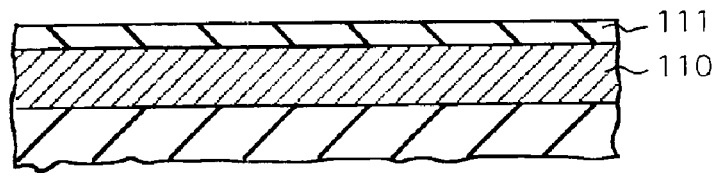

Preferred Embodiments of a Semiconductor Device Manufacturing Method According to the Present Invention First Embodiment In this first embodiment, as shown in FIGS. 2A to 2C, substrate 103 is loaded on the lower electrode 102 (see FIG. 1). The substrate 103 consists a copper wiring layer 110 formed on an underlying insulating film 112 such as $SiO_2$ film, or the like, which in turn, is formed on a silicon substrate (not shown).

Then, as shown in FIG. 2B, the surface of the copper wiring layer 110 is contacted with the plasma and reformed. This process is carried out under the following conditions A.

Conditions A temperature of the substrate 103: 375° C.

pressure in the chamber 101: 0.5 to 1.0 Torr frequency of the first high frequency power supply 107: 13.56 MHz power of the first high frequency power supply 107: 0 W (not applied)

frequency of the second high frequency power supply 109: 380 KHz power of the second high frequency power supply 109: 150 W process time: 30 sec process gas flow rate: see Table 1

TABLE 1

| Process gas | gas flow rate (sccm) | | | |
|---|---|---|---|---|
| | $N_2$ | $N_2O$ | $NH_3$ | $C_xH_y$ |
| ① $N_2$ | 100 | — | — | — |
| ② $N_2 + N_2O$ | 200 | 100 | — | — |
| ③ $N_2 + NH_3$ | 200 | — | 100 | — |
| ④ $N_2 + C_xH_y$ | 200 | — | — | 100 |

TABLE 1-continued

| | gas flow rate (sccm) | | | |
|---|---|---|---|---|
| Process gas | $N_2$ | $N_2O$ | $NH_3$ | $C_xH_y$ |
| ⑤ $N_2O + C_xH_y$ | — | 100 | — | 200 |
| ⑥ $N_2 + N_2O + C_xH_y$ | 100 | 100 | — | 100 |

As shown in Table 1, there are six types ① to ⑥ of the process gas. At least one of $N_2$ and $N_2O$ is contained in each of the process gases. These gases are converted to plasma in the chamber 101. In this case, $NH_3$ may be added as in the case of process gas ③ and $C_xH_y$ (hydrocarbon) may be added as in the cases of process gases ④ to ⑥ Specific examples of the $C_xH_y$ hydrocarbon are $CH_4$ and $C_2H_2$. It is postulated that if $C_xH_y$ is added, a thin film made of $C_xH_y$ is formed on the surface of the copper wiring layer 10 and it is believed that the copper wiring layer 110 is rendered difficult to etch in later steps by this thin film.

Then, as shown in FIG. 2C, a silicon-containing insulating film 111 is formed on the copper wiring layer 110. This silicon-containing insulating film 111 is formed by the plasma CVD method (Chemical Vapor Deposition method) under the following conditions B.

Conditions B temperature of the substrate 103: 375° C.

pressure in the chamber 101: 1.0 Torr frequency of the first high frequency power supply 107: 13.56 MHz power of the first high frequency power supply 107: 0 W (not applied)

frequency of the second high frequency power supply 109: 380 KHz power of the second high frequency power supply 109: 100 to 150 W deposited film thickness: 100 nm gas flow rate: see Table 2

TABLE 2

| Type of silicon-Containing | gas flow rate (sccm) | | | | | |
|---|---|---|---|---|---|---|
| Insulating film 111 | HMDSO | TMS $(Si(CH_3)_4)$ | $SiH_4$ | $N_2O$ | $NH_3$ | $CH_4$ |
| ① SiOCH | 50 | — | — | — | — | 100 |
| ② SiO | — | 50 | — | 100 | — | — |
| ③ SiN | — | — | 50 | 100 | 100 | — |
| ④ SiONCH | 50 | — | — | 200 | 100 | — |
| ⑤ SiCH | — | 50 | — | — | — | 100 |
| ⑥ SiCNH | — | 50 | — | — | 200 | 100 |

As shown in Table 2, an SiOCH film, an SiO film, an SiN film, an SiONCH film, an SiCH film, and an SiCNH film can be formed as the silicon-containing insulating film 111. These films can be formed by combining together the gases in Table 2. In the present invention, any one of these films may be formed. It should be noted that when the film is denoted as "SiXYZ film", this film is understood to contain at least Si, an X element, a Y element, and a Z element.

In Table 2, HMDSO (hexamethyldisiloxane: $(Si(CH_3)_3)_2O$) is liquid at room temperature (20° C.). The flow rate of the liquid HMDSO is adjusted by a liquid mass flow meter (not shown), and then the liquid HMDSO is vaporized by heating and the vapor is introduced into the chamber 101. Alternatively, in place of this process, the liquid HMDSO may be first vaporized, then the flow rate of the vaporized HMDSO may be adjusted by the high-temperature mass flow meter (not shown), and then the vaporized HMDSO may be supplied to the chamber 101. The flow rate of the HMDSO under the conditions B is that obtained when the HMDSO is vaporized in the above manner.

The dielectric constant of the SiOCH film, which was formed by using the HMDSO under the conditions B, was about 4.0. This value is lower than the dielectric constant of the SiN film. Furthermore, if the HMDSO is used, since Si (silicon) in the HMDSO is already bonded to O (oxygen) in the form of siloxane bonds (Si—O—Si), the Si—C bonds are reduced in the SiOCH film. As a result, the SiOCH film has a low dielectric constant, as explained above, and a suppressed leakage current. This is also the case for the SiONCH film that is formed by using HMDSO.

HMDSO has been mentioned as a compound having siloxane bonds, but advantages similar to the above can be obtained when any one of the following compounds having siloxane bonds is employed in place of the HMDSO.

OMCTS (octamethylcyclotetrasiloxane : $(Si(CH_3)_2)_4O_4$)

HEDS (hexaethyldisiloxane: $(Si(C_2H_5)_3)_2O$)

TMDS (tetramethyldisiloxane: $(SiH(CH_3)_2)_2O$)

TEDS (tetraethyldisiloxane: $(SiH(C_2H_5)_2)_2O$)

TMCTS (tetramethylcyclotetrasiloxane : $(SiH(CH_3))_4O_4$)

TECTS (tetraethylcyclotetrasiloxane: $(SiH(C_2H_5))_4O_4$)

If any one of these compounds is employed, the silicon-containing insulating film 111 with a suppressed leakage current and having a low dielectric constant can be formed.

Also, as shown in Table 2, the organic silane TMS (tetramethylsilane: $Si(CH_3)_4$) is employed to form the SiO film, the SiCH film, and the SiCNH film, but other organic silanes may be employed in place of TMS. Suitable other organic silanes include, for example, trimethylsilane (SiH $(CH_3)_3$), dimethylsilane ($SiH_2(CH_3)_2$), and monomethylsilane ($SiH_3(CH)$).

The tendency of copper diffusion from the copper wiring layer 110 into the silicon-containing insulating film 111 will be explained with reference to FIG. 3 and FIG. 4. Particularly, the case where $N_2$ (see ① in Table 1) is used as the process gas under the above conditions A, along with use of the SiOCH film (see ① in Table 2) as the silicon-containing insulating film 111 will be explained.

Figure 3:
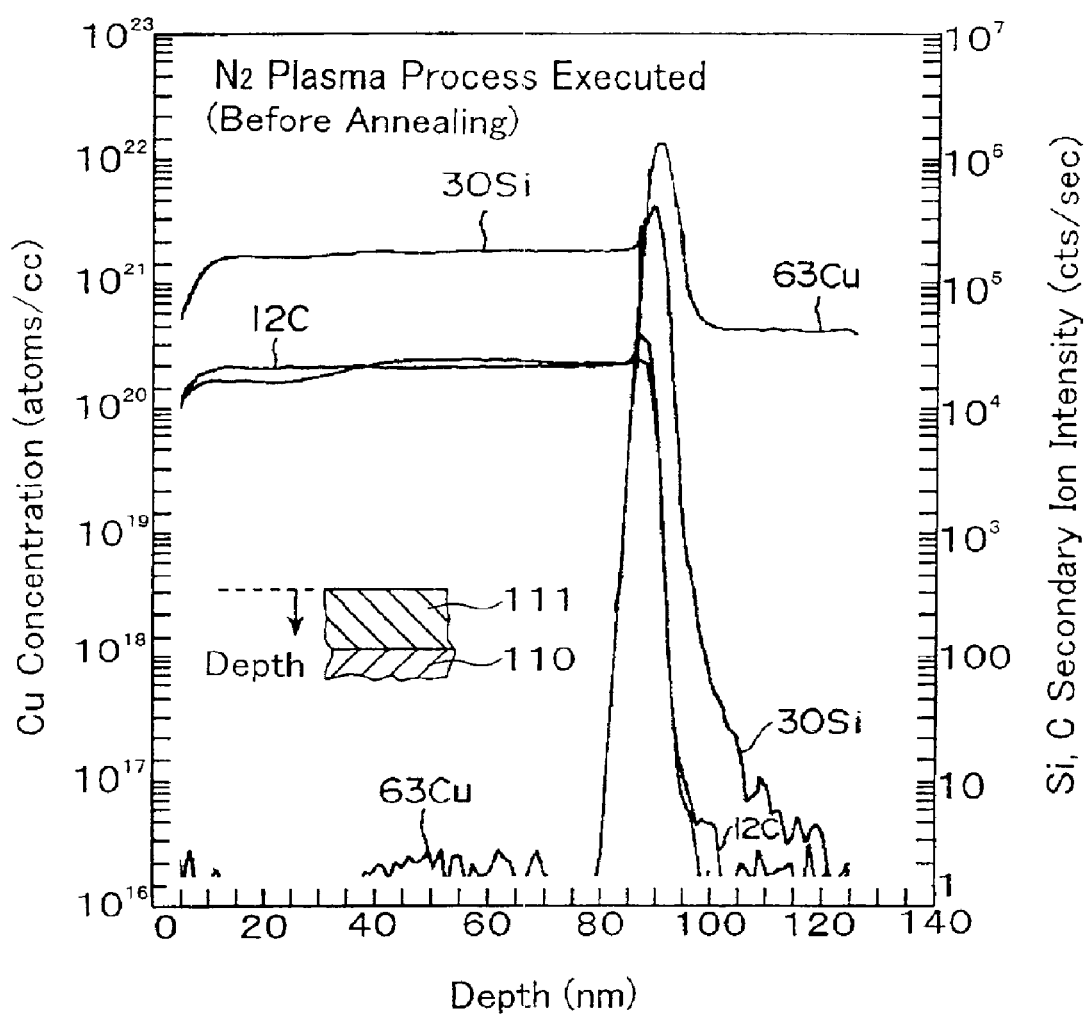
FIG. 3 is a graph of content of the elements contained in the silicon-containing insulating film, as determined by SIMS examination, immediately after the film formation, versus depth, in the first embodiment of the method of the present invention, i.e. before annealing.

FIG. 3 is a graph of the results of SIMS (Secondary-Ion-Mass-Spectroscopy), assay of the elements that are contained in the silicon-containing insulating film 111 immediately after the film was formed. In this examination, the relationships between a depth from the surface of the silicon-containing insulating film 111 and a Cu (copper) concentration at that depth were examined. The abscissa in FIG. 3 denotes the depth (nm) from the surface of the insulating film 111 on a linear scale, and the ordinate on the left side denotes the Cu (copper) concentration (atoms/cc, i.e., the number of atoms per 1 cc) on a logarithmic scale. In this examination, secondary ion intensity (cts/sec) of Si (silicon) and C (carbon) contained in the film were also examined. The ordinate on the right side of the FIG. 3 denotes the secondary ion intensity (cts/sec) of Si (silicon) and C (carbon) on a logarithmic scale.

In FIG. 3, the numerical value affixed to the left side of the symbol of an element indicates the mass number of this element.

Figure 4:
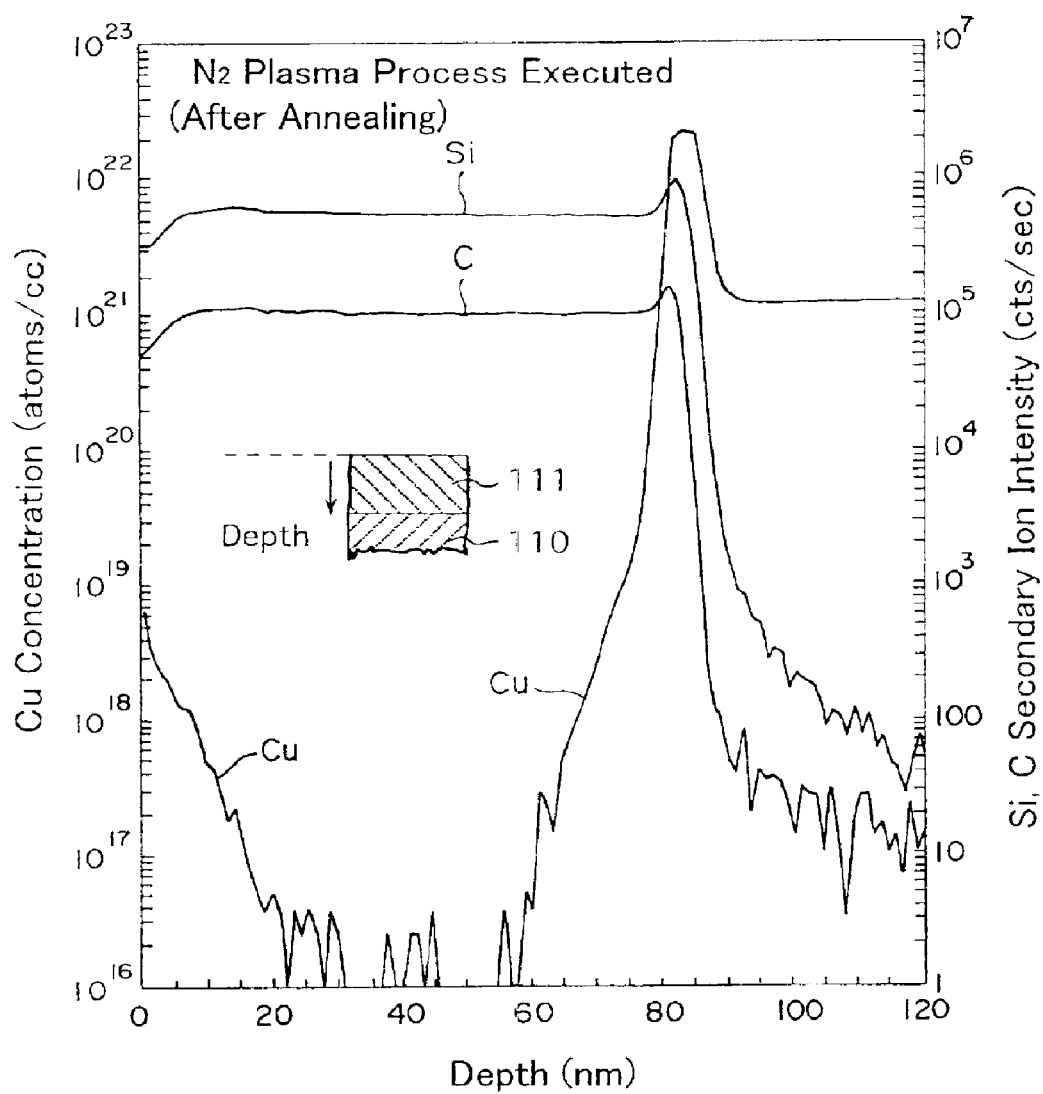
FIG. 4 is a graph of content of the elements contained in the silicon-containing insulating film, as determined by SIMS, after the silicon-containing insulating film is annealed in vacuum at 500° C. for 4 hours, versus depth, in the first embodiment of the method of the present invention.

FIG. 4 is a graph showing content of the elements contained in the silicon-containing insulating film 111 versus depth after the silicon-containing insulating film 111 examined in FIG. 3 was annealed in vacuum at 500° C. for 4 hours. This examination was carried out in a manner similar to that in FIG. 3.

Focusing on the copper concentration at a depth of 60 to 80 nm in FIG. 4 reveals that gradient of the graph in this region is relatively steep, which indicates that little copper diffused from the copper wiring 110 into the insulating film 111.

In addition, as shown in FIG. 4, Cu (copper) contained in the silicon-containing insulating film 111 is very small in the middle range (the depth of about 20 to 60 nm) of the film. In practice, it is preferable that the number of Cu atoms in the middle range of the film be less than $10^{17}$. It can be seen that the present method fulfills this condition.

The foregoing shows that the present invention can prevent copper diffusion even when annealing is performed.

Figure 5:
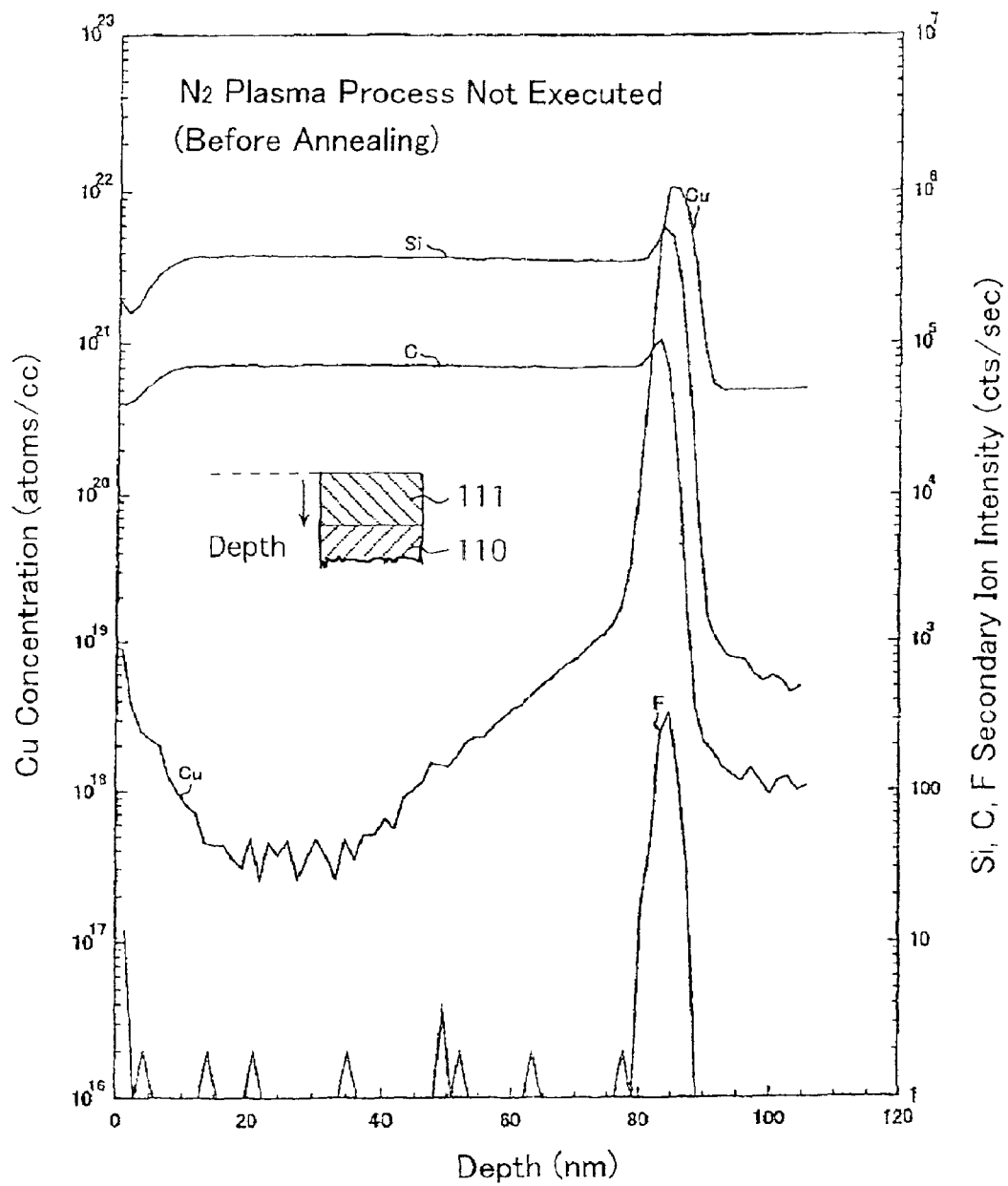
FIG. 5 is a graph of content of the elements contained in the silicon-containing insulating film immediately after the film formation, versus depth, when the $N_2$ plasma treatment is omitted.

Next, in order to further confirm the effect of the $N_2$ plasma, the case where the $N_2$ plasma treatment is omitted will be explained with reference to FIG. 5 and FIG. 6 hereunder. FIG. 5 is a graph showing SIMS examination results, obtained immediately after the silicon-containing insulating film 111 was formed, for the elements that were contained in the silicon-containing insulating film 111 that was not subjected to the $N_2$ plasma treatment. In this case only the step shown in FIG. 2C is executed, without executing the step in FIG. 2B, directly after the step shown in FIG. 2A is executed. Also, FIG. 6 is a graph showing the results of SIMS examination for the elements contained in the insulating film 111 of FIG. 5, which was further subjected to annealing in vacuum at 500° C. for 4 hours.

Figure 6:
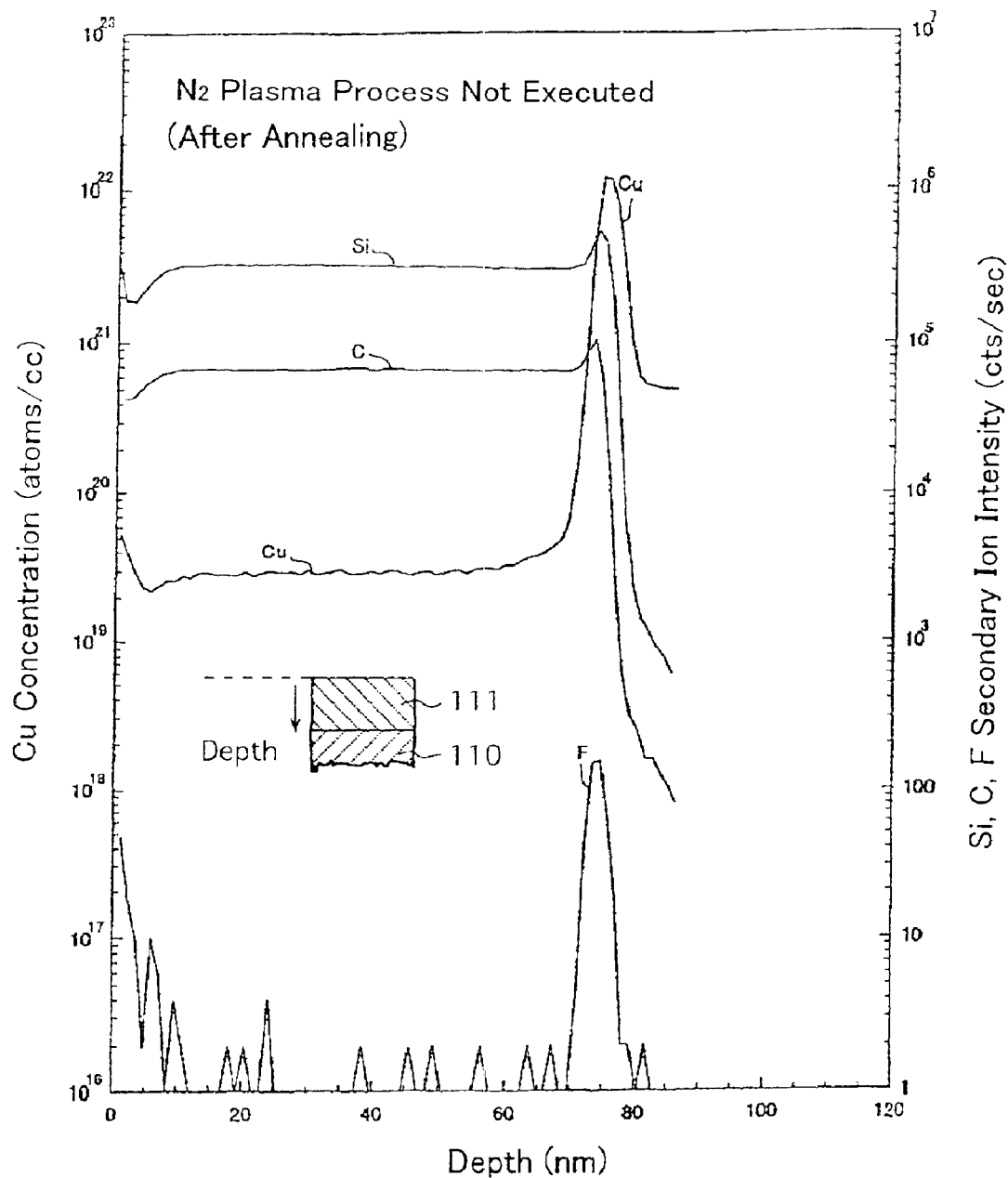
FIG. 6 is a graph of content of the elements contained in the silicon-containing insulating film which is not subjected to the $N_2$ plasma treatment, but which is annealed in vacuum at 500° C. for 4 hours after the film formation.

In FIG. 5 and FIG. 6, the abscissa denotes depth (nm) from the surface of the insulating film 111 on a linear scale. The ordinate on the left side denotes the Cu (copper) concentration (atoms/cc) on a logarithmic scale. The ordinate on the right side denotes secondary ion intensity (cts/sec) of Si (silicon), C (carbon), and F (fluorine), on a logarithmic scale.

As is apparent from comparing the Cu (copper) concentration of FIG. 5 (before the annealing) and that of FIG. 6 (after the annealing), it can be understood that the annealing causes the copper of the copper wiring layer 110 to diffuse into the silicon-containing insulating film 111.

On the other hand, comparing the Cu (copper) of FIG. 4 (with the $N_2$ plasma treatment) and that of FIG. 6 (without the $N_2$ plasma treatment) reveals the effect of the plasma treatment. That is, it can be understood that the Cu (copper) concentration in FIG. 4 is lower than that in FIG. 6.

The results shown in FIG. 3 to FIG. 6, verify that if the surface of the copper wiring layer 110 is exposed to the plasma under the conditions A, a surface portion of the copper wiring layer 110 is reformed to function as a copper diffusion preventing layer. The inventors speculate that the surface portion of the copper wiring layer 110 is nitrided by the plasma process and thus a thin film of copper nitride is formed from the surface portion, and this thin film serves as a copper diffusion preventing layer.

This means that the copper wiring layer 110 itself functions to prevent copper diffusion. Therefore, according to the first embodiment, there is no need for the copper diffusion preventing film formed on the copper wiring layer 110 to have superior ability in preventing the copper diffusion. For this reason, there is no need in the first embodiment for a high dielectric constant film such as the SiN film employed in the prior art for its superior ability in preventing the copper diffusion.

Second Embodiment

A second embodiment will now be explained with reference to FIGS. 7A to 7C.

Figure 7A:
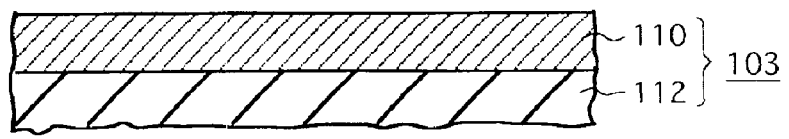
FIGS. 7A to 7C are sectional views showing steps of manufacturing a semiconductor device according to a second embodiment of the method of the present invention.

In this embodiment, as shown in FIG. 7A, a substrate 103 is loaded on the lower electrode 102 (see FIG. 1). The substrate 103 has copper wiring layer 110 formed on an underlying insulating film 112 which, in turn, is formed on a silicon substrate.

Figure 7B:
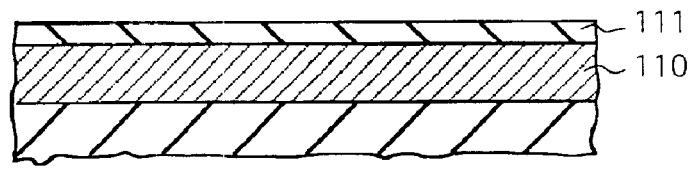

Then, as shown in FIG. 7B, the silicon-containing insulating film 111 with a film thickness of 100 nm is formed on the copper wiring layer 110. This silicon-containing insulating film 111 is formed by the CVD method in accordance with the conditions B given above for the first method.

Figure 7C:
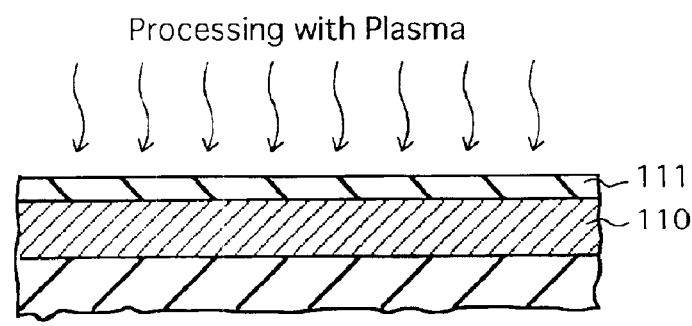

In turn, as shown in FIG. 7C, the surface of the silicon-containing insulating film 111 is reformed by the plasma process in accordance with following conditions C.

Conditions C temperature of the substrate 103: 375° C.

pressure in the chamber 101: 0.5 to 6.0 Torr power of the first high frequency power supply 107: 0 W (not applied)

frequency of the second high frequency power supply 109: 380 KHz power of the second high frequency power supply 109: 150 W process time: 30 sec process gas flow rate: see Table 3

TABLE 3

| Process gas | gas flow rate (sccm) |
|---|---|
| ① $NH_3$ | 100 to 300 |
| ② $N_2$ | 100 to 300 |
| ③ $N_2O$ | 100 to 300 |

At least one of $NH_3$, $N_2$, and $N_2O$ in Table 3 may be employed as the process gas.

Though only the second high frequency power supply 109 is employed under the conditions C, the first high frequency power supply 107 may be employed together with the second high frequency power supply 109. Alternatively, the first high frequency power supply 107 may be employed without employing the second high frequency power supply 109.

Next, the results of examination of the copper diffusion from the copper wiring layer 110 into the silicon-containing insulating film 111 will be explained with reference to FIG. 8. In particular, the case where the SiOCH film (see ① in Table 2) is used as the silicon-containing insulating film 111, and $NH_3$ (see ① in Table 3) is used as the process gas under the conditions C will be explained.

Figure 8:
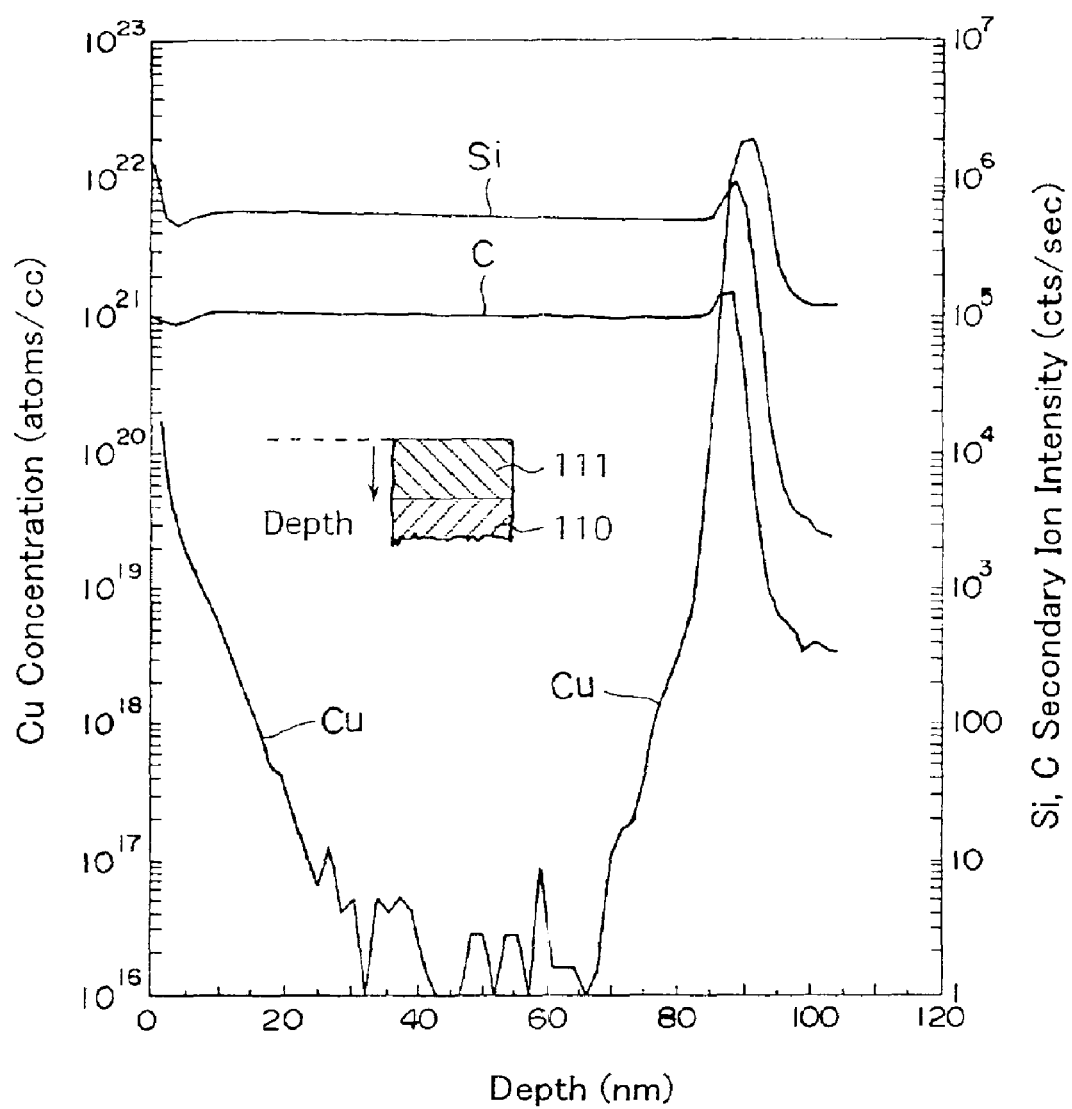
FIG. 8 is a graph of content of the elements contained in the silicon-containing insulating film when such silicon-containing insulating film is annealed in vacuum at 450° C. for 4 hours after the film formation, in the second embodiment of the method of the present invention.

FIG. 8 is a graph showing the results of SIMS examination of the relationship between the depth (nm) from the surface of the silicon-containing insulating film 111 and the Cu (copper) concentration (atoms/cc) at that depth, when the insulating film 111 is annealed in vacuum at 450° C. for 4 hours after subjected to the $NH_3$ plasma process. As in the first embodiment, the relationship between the depth (nm) from the surface of the insulating film 111 and the secondary ion intensity (cts/sec) of Si (silicon) and C (carbon) at that depth were also examined. The SIMS examination method was similar to that employed in the first embodiment.

As shown in FIG. 8, there is little diffusion of Cu (copper) in this embodiment. In addition, it can be understood from comparing FIG. 6 (without the $NH_3$ plasma process) and FIG. 8 (with the $NH_3$ plasma process), that the Cu (copper) concentration in FIG. 8 (with the $NH_3$ plasma process) is lower.

Thus, exposing the surface of the silicon-containing insulating film 111 allows the film 111 to be reformed and to function as a copper diffusion preventing film.

Figure 9:
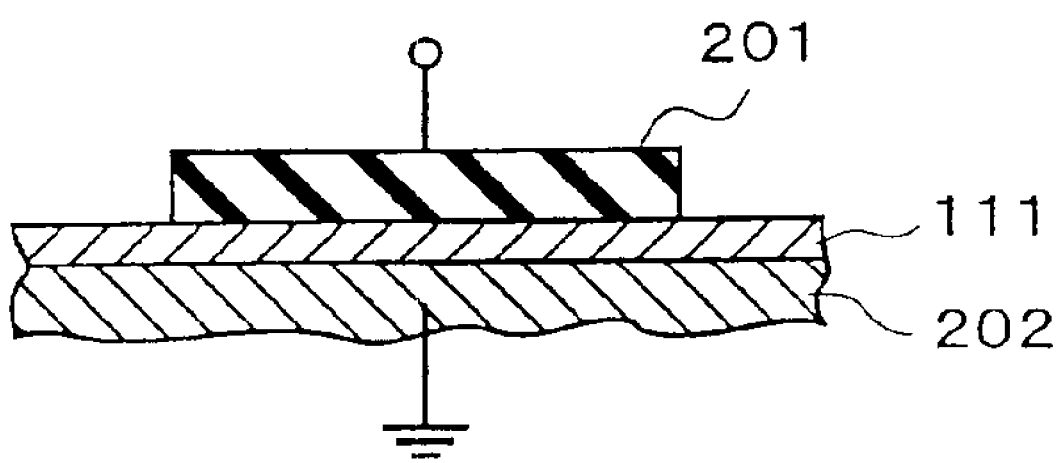
FIG. 9 is a sectional view illustrating measurement of the leakage current of the silicon-containing insulating film, in the second embodiment of the method of the present invention.

In this example, a SiOCH film is employed as the silicon-containing insulating film 111 and this film is formed by using a reaction gas containing the HMDSO (see the conditions B). Therefore, as has already been explained, not only the dielectric constant of the film can be lowered to about 4 but also the leakage current can be suppressed. The inventors actually measured this leakage current. FIG. 9 shows a sectional structure which illustrates measurement of leakage current. In FIG. 9, 202 denotes a p-type silicon substrate that is grounded. Then, the silicon-containing insulating film 111 was formed on this p-type silicon substrate 202 under the conditions B. Also, 201 denotes a mercury probe used to apply the test voltage to the silicon-containing insulating film 111.

Figure 10:
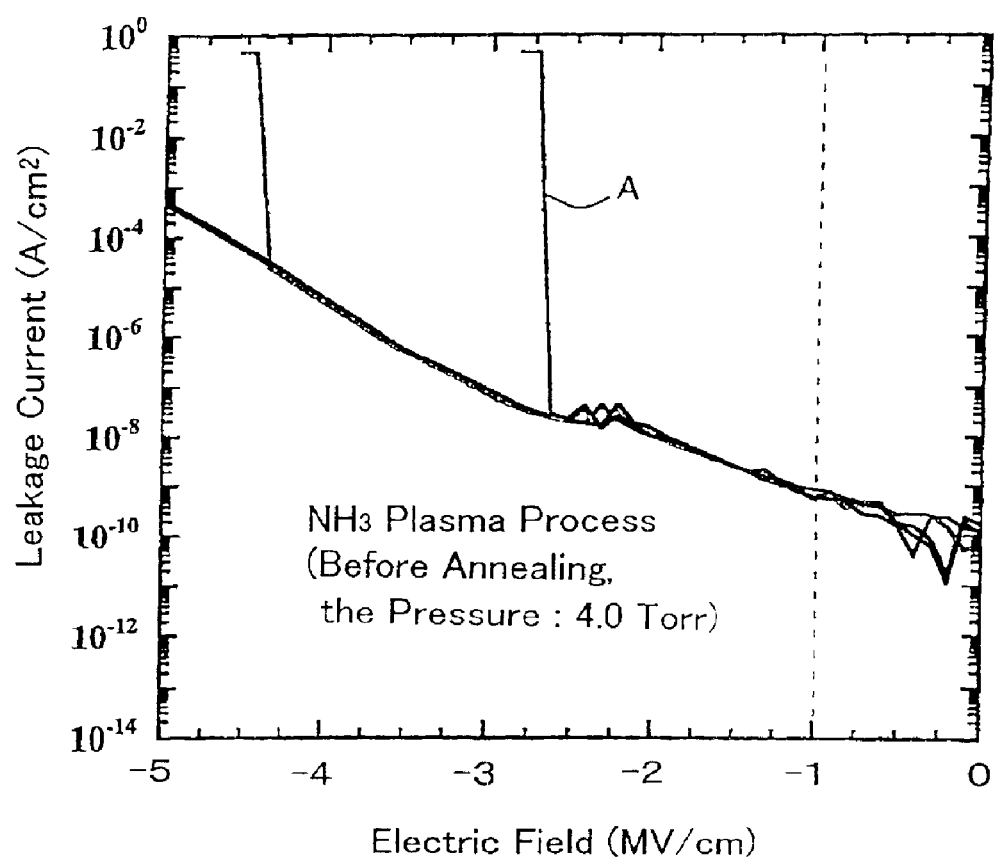
FIG. 10 is a graph showing the leakage current of the silicon-containing insulating film when the $NH_3$ plasma process is performed for the silicon-containing insulating film immediately after the film formation, in the second embodiment of the method of the present invention.
Figure 11:
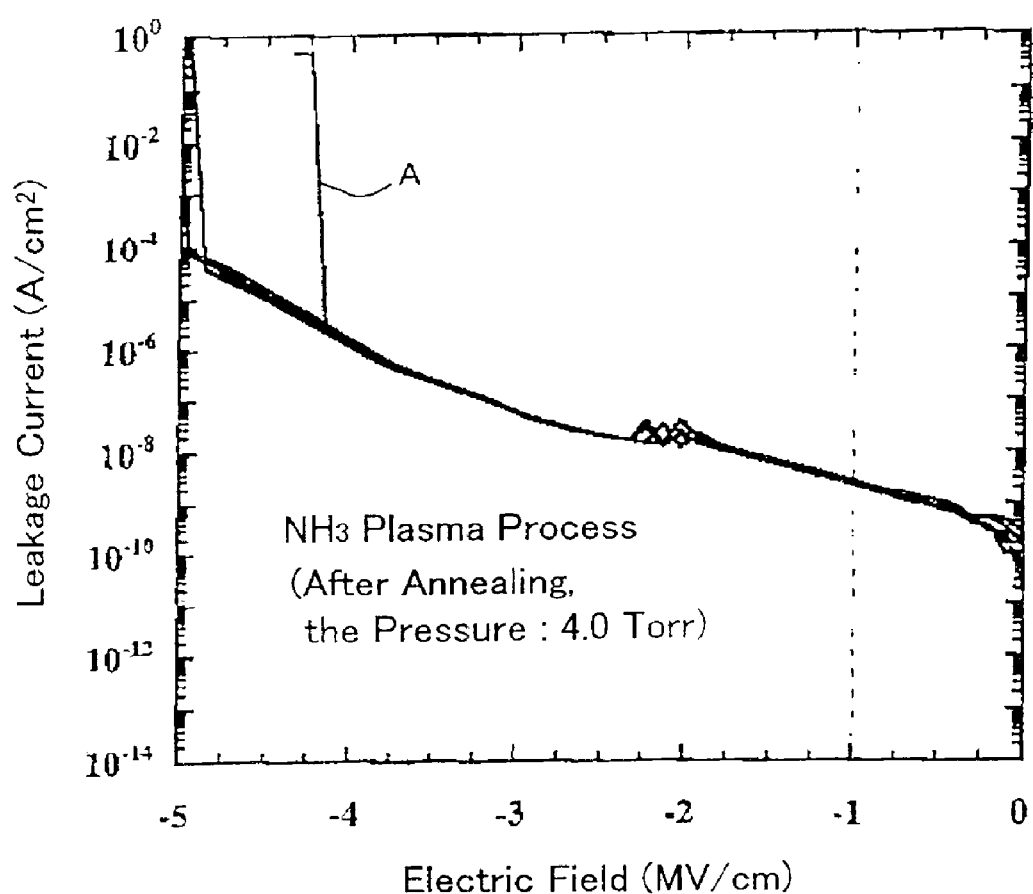
FIG. 11 is a graph showing the leakage current of the silicon-containing insulating film after such silicon-containing insulating film is subjected to the $NH_3$ plasma process and is then annealed, in the second embodiment of the method of the present invention.

Measured results are shown in FIG. 10 and FIG. 11. In these figures, the abscissa denotes electric field strength (MV/cm) applied to the mercury probe 201 (see FIG. 9) on a linear scale. A minus sign in the abscissa shows that a negative voltage is applied to the mercury probe 201. The ordinate denotes the leakage current ($A/cm^2$) on a logarithmic scale.

FIG. 10 is a graph showing the leakage current in the insulating film 111 when the $NH_3$ plasma treatment (under the conditions C) was performed for the insulating film 111 immediately after the insulating film 111 was formed.

On the other hand, FIG. 11 is a graph showing the leakage current of the insulating film 111 after it was subjected to the $NH_3$ plasma treatment (under the conditions C) and was then annealed. The annealing was carried out in vacuum at 450° C. for 4 hours.

As is apparent from comparing FIG. 10 and FIG. 11, the leakage current characteristic of the insulating film 111 that is subjected to the $NH_3$ plasma treatment is seldom changed by the annealing. Focusing on the curve A in FIG. 10 and FIG. 11 shows that the curve A shifts to the left side (higher electric field side) when annealing is performed (FIG. 11). Therefore, it can be expected that the leakage current characteristic can be improved by the annealing.

As described above, according to this embodiment, the copper diffusion can be prevented by the silicon-containing insulating film 111 whose dielectric constant is lower than that of the prior art and in which the leakage current is suppressed. Since the dielectric constant is lower than the prior art, insulating film 111 does not have the problem of lowering the operating speed of the semiconductor device as in the prior art.

It should be noted that the first and the second embodiments may be executed independently as in the above or in combination thereof. Combining the first and the second embodiment leads to the same advantages as described above.

Explanation of Removing the Natural Oxide Film from the Surface of the Copper Wiring Layer 110

The first and the second embodiments explained above may be executed after the natural oxide film on the surface of the copper wiring layer 110 is removed. This prevents the silicon-containing insulating film 111 from peeling off from the copper wiring layer 110. In order to remove the natural oxide film of the copper wiring layer 110 in the present embodiments, the surface of the copper wiring layer 110 is exposed to the $NH_3$ plasma. The $NH_3$ plasma process conditions are given as the following conditions D.

Conditions D
$NH_3$ flow rate: 500 sccm
temperature of the substrate 103: 375° C.
pressure in the chamber 101: 6.0 Torr
frequency of the first high frequency power supply 107: 13.56 MHz
power of the first high frequency power supply 107: 400 W
power of the second high frequency power supply 109: 0 W (not applied)
process time: 10 sec

EXAMPLES OF THE PRESENT INVENTION

Next, examples of the present invention will be explained hereunder. In the following, the present invention is applied to the damascene method that is useful for forming the copper wiring layer. FIGS. 12A to 12H are sectional views showing the case where the present invention is applied to the damascene method.

Figure 12A:
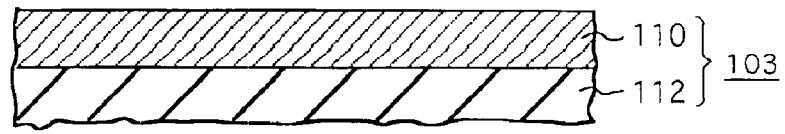
FIGS. 12A to 12H are sectional views showing application of the present invention to the damascene method.

Firstly, as shown in FIG. 12A, the substrate 103 is prepared. This substrate 103 consists of the copper wiring layer (lower wiring) 110 formed on the underlying insulating film 112, such as a $SiO_2$ film, which, in turn, is formed on the silicon substrate.

Figure 12B:

Then, as shown in FIG. 12B, in order to remove the natural oxide film from the surface of the copper wiring layer 110, the surface is exposed to the $NH_3$ plasma. The conditions for the $NH_3$ plasma process are the conditions D given above.

Figure 12C:
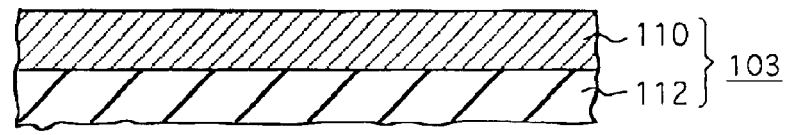

Then, as shown in FIG. 12C, the surface of the copper wiring layer 110, whose natural oxide film has been removed, is treated with the plasma. The conditions for this plasma process are given as the conditions A explained above in connection with the first embodiment. The surface layer portion of the copper wiring layer 110 is reformed by this plasma treatment, and this surface layer portion functions as the copper diffusion barrier.

Figure 12D:
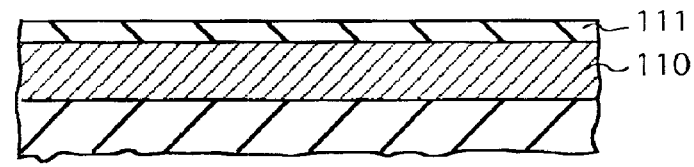

In turn, as shown in FIG. 12D, the silicon-containing insulating film 111 is formed on the copper wiring layer 110. This silicon-containing insulating film 111 is formed under the conditions B explained above. Since the silicon-containing insulating film 111 functions as the block insulating film in the present example, the insulating film 111 is referred to as a block insulating film 111 in the following. Also, because the natural oxide film of the copper wiring layer 110 has been removed in the step shown in FIG. 12B, the block insulating film 111 is difficult to peel off from the copper wiring layer 110.

As explained above in the second embodiment, after the block insulating film 111 is formed, the surface of the insulating film 111 may be exposed to the plasma in accordance with the above conditions C. In this case, the plasma treatment shown in FIG. 12C may be omitted. Since the block insulating film 111 subjected to the plasma treatment has the function of preventing the diffusion of copper, there is no possibility that the copper will diffuse into the interlayer insulating film later formed on the insulating film 111, even if the plasma treatment of FIG. 12C is omitted.

Figure 12E:
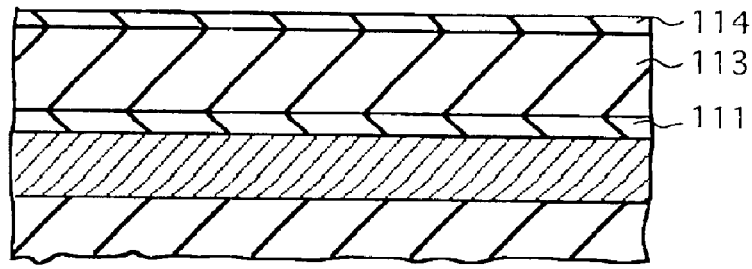

Then, as shown in FIG. 12E, the interlayer insulating film 113 of low dielectric constant is formed on the block insulating film 111, and a protection film 114 is formed thereon. The interlayer insulating film 113 may be the well-known FSG (Fluorinated Silicon Oxide) or a porous $SiO_2$ film, for example. As the protection film 114, a NSG film (the silicon oxide film not containing impurities) that has a thin thickness and a high density is employed. If the protection film 114 is omitted, the quality of the interlayer insulating film 113 is altered by the process gas used in washing the photoresist 115 (described later) or by the etching gas used for etching the block insulating film 111 which lies under the interlayer insulating film 113, and the low dielectric constant characteristic of the insulating film 113 is thereby degraded. If, however, this is not problematic, the protection film 114 may be dispensed with.

Figure 12F:
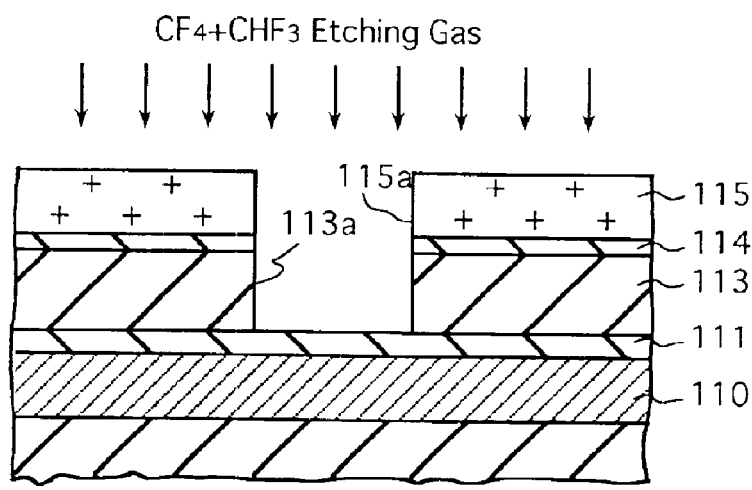

Then, as shown in FIG. 12F, the photoresist 115 is coated on the protection film 114, and then an opening 115a is formed in the photoresist 115 by photolithography. Then, an opening 113a reaching down to the block insulating film 111 is formed by etching the interlayer insulating film 113 and the protection film 114 via the opening 115a, using reactive ion etching (RIE). In this etching, a gas mixture of $CF_4$ + $CHF_3$ is employed as the etching gas, and the block insulating film 111 has etching resistance against this etching gas. In other words, the block insulating film 111 functions as the etching stopper film.

Figure 12G:
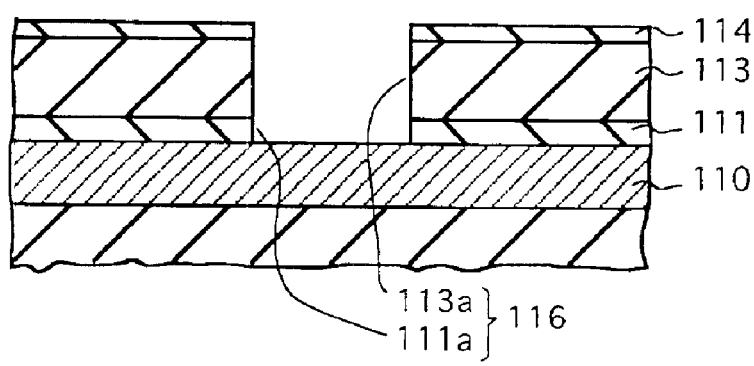

Then, as shown in FIG. 12G, after ashing and removing the photoresist 115, an opening 111a reaching the copper wiring layer 110 is formed by etching the block insulating film 111 via the opening 113a. This etching is carried out by reactive ion etching (RIE). In this etching, a gas mixture of $CF_4$+$CHF_3$, which is employed in etching the interlayer insulating film 113 but whose component ratio is changed, is employed as the etching gas. Since the copper wiring layer 110 has etching resistance against this etching gas, the copper wiring layer 110 is not etched by this etching. In this step, a via hole 116 defined by the openings 111a and 113a is formed.

Figure 12H:
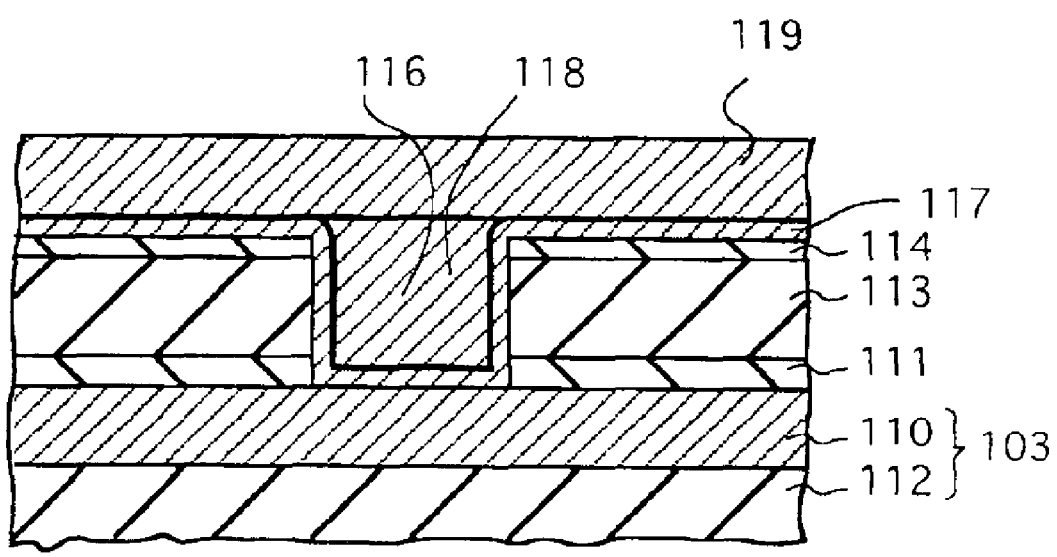

Then, as shown in FIG. 12H, a seed layer 117 of copper is formed on inner walls of the via hole 116 and on the protection film 114 by sputtering. After this, a first electrolytically plated copper film 118 is formed on the seed layer 117 by applying electrical power to this seed layer 117. Then, the first electrolytically plated copper film 118 that is formed above the via hole 116 is removed by CMP (Chemical Mechanical Polishing). According to these steps, a structure is formed in which the plug of the first electrolytically copper-plated film 118 is buried in the via hole 116.

Finally, a second electrolytically plated copper film (upper wiring) 119 is formed on the seed layer 117 and on the first electrolytically copper-plated film 118 by supplying electrical power to the seed layer 117 once again.

Following the above steps leads to a structure in which the copper wiring layer (lower wiring) 110 and the electrolytically plated copper film (upper wiring) 119 are separated by the interlayer insulating film 113, but are electrically connected via the plug.

As has already been explained, when the plasma treatment is applied to the surface of the copper wiring layer (lower wiring) 110 in accordance with the above conditions A, the surface layer portion of the copper wiring layer (lower wiring) 110 is reformed into a copper diffusion preventing layer. As a result, there is no need to employ the SiN film of the prior art, which has the high dielectric constant, as the block insulating film 111 formed on the copper wiring layer (lower wiring) 110. Instead, according to the present invention, films listed in Table 2 can be employed. Among these films, SiOCH film and the SiONCH film, both of which are formed using HMDSO, suppress the leakage current and have a low dielectric constant (about 4.0). Therefore, present example can provide a semiconductor device having high operational speed.

To summarize, according to the semiconductor device manufacturing method of the present invention, a process gas containing any one of $N_2$ and $N_2O$ is converted to a plasma and then the surface of the copper wiring layer is exposed to the process gas plasma. Alternatively, a process gas containing $N_2$ and $NH_3$ is converted to a plasma and then contacted with the surface of the copper wiring layer. By these plasma processes, the surface layer portion of the copper wiring layer can be reformed and made into a copper diffusion preventing layer. Since the copper wiring layer itself functions to prevent copper diffusion, superior capability for preventing copper diffusion is not required for the copper diffusion preventing film, such as the block insulating film or the like, formed on the copper wiring layer. Therefore, there is no need to use high dielectric constant films, such as SiN film, which are used in the prior art for their superior ability to prevent copper diffusion.

If the surface of this copper wiring layer is exposed to the $NH_3$ plasma before the surface layer portion of the copper wiring layer is reformed, the natural oxide film formed on the surface of the copper wiring can be removed.

Also, instead of reforming the surface of the copper wiring layer as above, the silicon-containing insulating film may be formed on the copper wiring layer, and then the process gas containing at least one of $NH_3$, $N_2$, and $N_2O$ is converted to a plasma, and then the surface of the silicon-containing insulating film may be exposed to the plasma of the process gas. In this manner, the silicon-containing insulating film is reformed to act as a copper diffusion preventing film.

In this case, if the silicon-containing insulating film is formed by the chemical vapor deposition method using a reaction gas that contains a compound having a siloxane bonds, such silicon-containing insulating film can have a low dielectric constant and suppress the leakage current. As a result, this silicon-containing insulating film does not have the problem that the leakage current increases as in the prior art and the operational speed of the semiconductor device is not slowed due to a high dielectric constant as with the SiN film.

Although the invention has been described with reference to specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the concept and the specific embodiments disclosed may be readily utilized as a basis for modifying or designing other structures for carrying out the purposes of the present invention. It should also be realized by those skilled in the art that such equivalent constructions do not depart form the spirit and scope of the invention as set forth in the appended claims. It is therefore contemplated that the claims will cover any such modifications or embodiments that fall within the true scope of the invention.

What is claimed is:

1. A semiconductor device manufacturing method comprising the steps of:
   converting into a plasma a process gas consisting essentially of $N_2O$ and a hydrocarbon $C_xH_y$;
   forming a copper diffusion preventing layer by exposing a surface of the copper wiring layer to the process gas plasma and forming a silicon-containing insulating layer on the copper diffusion preventing layer.

2. A semiconductor device manufacturing method according to claim 1, wherein $N_2$ is added to the process gas.

3. A semiconductor device manufacturing method according to claim 1, further comprising the step of:
   before converting the process gas into the plasma, exposing the surface of the copper wiring layer to a $NH_3$ plasma to remove surface oxide from the copper wiring layer.

4. A semiconductor device manufacturing method according to claim 1, further comprising the step of:
   converting into a second plasma a process gas containing at least one of $NH_3$, $N_2$, and $N_2O$; and
   exposing the silicon-containing insulating layer to the second process gas plasma.

5. A semiconductor device manufacturing method according to claim 1, further comprising the steps of:
   forming an interlayer insulating film on the silicon-containing insulating film;
   forming a via hole in the silicon-containing insulating film and the interlayer insulating film;
   burying a plug, electrically connected to the copper wiring, in the via hole; and
   forming an upper wiring layer, electrically connected to the plug, on the interlayer insulating film.

6. A semiconductor device manufacturing method according to claim 5, wherein the interlayer insulating film is a FSG film or a porous $SiO_2$ film.

7. A semiconductor device manufacturing method according to claim 1, wherein the silicon-containing insulating layer is selected from the group consisting of a SiOCH layer, a SiCH layer, a SiO layer, a SiN layer, a SiONCH layer, and a SiCNH layer.

8. A semiconductor device manufacturing method according to claim 7, wherein the silicon-containing insulating layer is a SiOCH film formed by chemical vapor deposition using a reaction gas containing a compound having siloxane bonds.

9. A semiconductor device manufacturing method according to claim 7, wherein the silicon-containing insulating layer is a SiONCH film formed by chemical vapor deposition using a reaction gas containing a compound having siloxane bonds and $N_2O$.

10. A semiconductor device manufacturing method according to claim 9, wherein the compound having the siloxane bonds is selected from the group consisting of HMDSO $((Si(CH_3)_3)_2O)$, OMCTS $((Si(CH_3)_2)_4O_4)$, HEDS $((Si(C_2H_5)_3)_2O)$, TMDS $((SiH(CH_3)_2)_2O)$, TEDS $((SiH(C_2H_5)_2)_2O)$, TMCTS $((SiH(CH_3))_4O_4)$, and TECTS $((SiH(C_2H_5))_4O_4)$.

11. A semiconductor device manufacturing method according to claim 7, wherein the silicon-containing insulating layer is a SiN film formed by chemical vapor deposition using a reaction gas containing $SiH_4$ and $N_2O$.

12. A semiconductor device manufacturing method according to claim 11, wherein $NH_3$ is added to the reaction gas.

13. A semiconductor device manufacturing method according to claim 7, wherein the silicon-containing insulating layer is a SiO film formed by chemical vapor deposition using a reaction gas containing an organic silane.

14. A semiconductor device manufacturing method according to claim 13, wherein the organic silane is TMS $(Si(CH_3)_4)$.

15. A semiconductor device manufacturing method according to claim 7, wherein the silicon-containing insulating layer is a SiCH film formed by chemical vapor deposition using a reaction gas containing organic silane and hydrocarbon.

16. A semiconductor device manufacturing method according to claim 15, wherein the hydrocarbon is $CH_4$ or $C_2H_2$.

17. A semiconductor device manufacturing method according to claim 7, wherein the silicon-containing insulating layer is a SiCNH film formed by chemical vapor deposition using a reaction gas containing $NH_3$, organic silane, and hydrocarbon.

18. A semiconductor device manufacturing method according to claim 8, wherein the compound having the siloxane bonds is selected from the group consisting of HMDSO $((Si(CH_3)_3)_2O)$, OMCTS $((Si(CH_3)_2)_4O_4)$, HEDS $((Si(C_2H_5)_3)_2O)$, TMDS $((SiH(CH_3)_2)_2O)$, TEDS $((SiH(C_2H_5)_2)_2O)$, TMCTS $((SiH(CH_3))_4O_4)$, and TECTS $((SiH(C_2H_5))_4O_4)$.

* * * * *

UNITED STATES PATENT AND TRADEMARK OFFICE
CERTIFICATE OF CORRECTION

PATENT NO. : 6,911,405 B2
DATED : June 28, 2005
INVENTOR(S) : Yoshimi Shioya et al.

It is certified that error appears in the above-identified patent and that said Letters Patent is hereby corrected as shown below:

Title page,
Item [56], References Cited, U.S. PATENT DOCUMENTS, add:
-- 6,150,270
  6,174,810
  6,251,771
  6,277,733
  6,335,283
  6,383,925
  6,417,092 --.

Signed and Sealed this

Twentieth Day of December, 2005

JON W. DUDAS
*Director of the United States Patent and Trademark Office*